United States Patent [19]

Frogge

[11] 4,081,854
[45] Mar. 28, 1978

[54] METER PROTECTION CIRCUIT

[76] Inventor: Jerry M. Frogge, 16475 Roberts, Roseville, Mich. 48066

[21] Appl. No.: 737,406

[22] Filed: Nov. 1, 1976

[51] Int. Cl.² .............................................. H02H 3/08
[52] U.S. Cl. ..................................... 361/104; 361/1
[58] Field of Search ................ 361/1, 56, 57, 58, 103, 361/112, 91, 104; 340/250, 253 A; 324/110, 51; 323/9; 320/24, 44, 45, 47, 48, 51, 55

[56] References Cited

U.S. PATENT DOCUMENTS

| 2,571,048 | 10/1951 | Medlar | 340/250 |
| 3,341,762 | 9/1967 | Rockoff | 320/55 |

Primary Examiner—J D. Miller
Assistant Examiner—Patrick R. Salce
Attorney, Agent, or Firm—Basile and Weintraub

[57] ABSTRACT

A circuit for protecting an electric meter having its input connected to a source of DC current. The system includes three circuit breakers having their outputs connected in parallel, while their inputs are connected to the output of the electric meter through a plurality of switches adapted to provide the user with means for selectively choosing one or more of the circuit breakers in a predetermined combination such that the meter may be set to measure the current flow through a circuit wherein the amount of current permitted to flow through the meter may be selectively varied. The outputs of the circuit breakers are electrically connected to the circuit to be tested through an on-off switch which permits the user to selectively initiate testing of a circuit, as desired. The input to the electric meter and the output of the on-off switches are electrically connected through a signaling device which is operable to provide the user with a warning that the circuit is overloaded and that one of the circuit breakers has been activated to terminate flow through the electrical meter.

3 Claims, 1 Drawing Figure

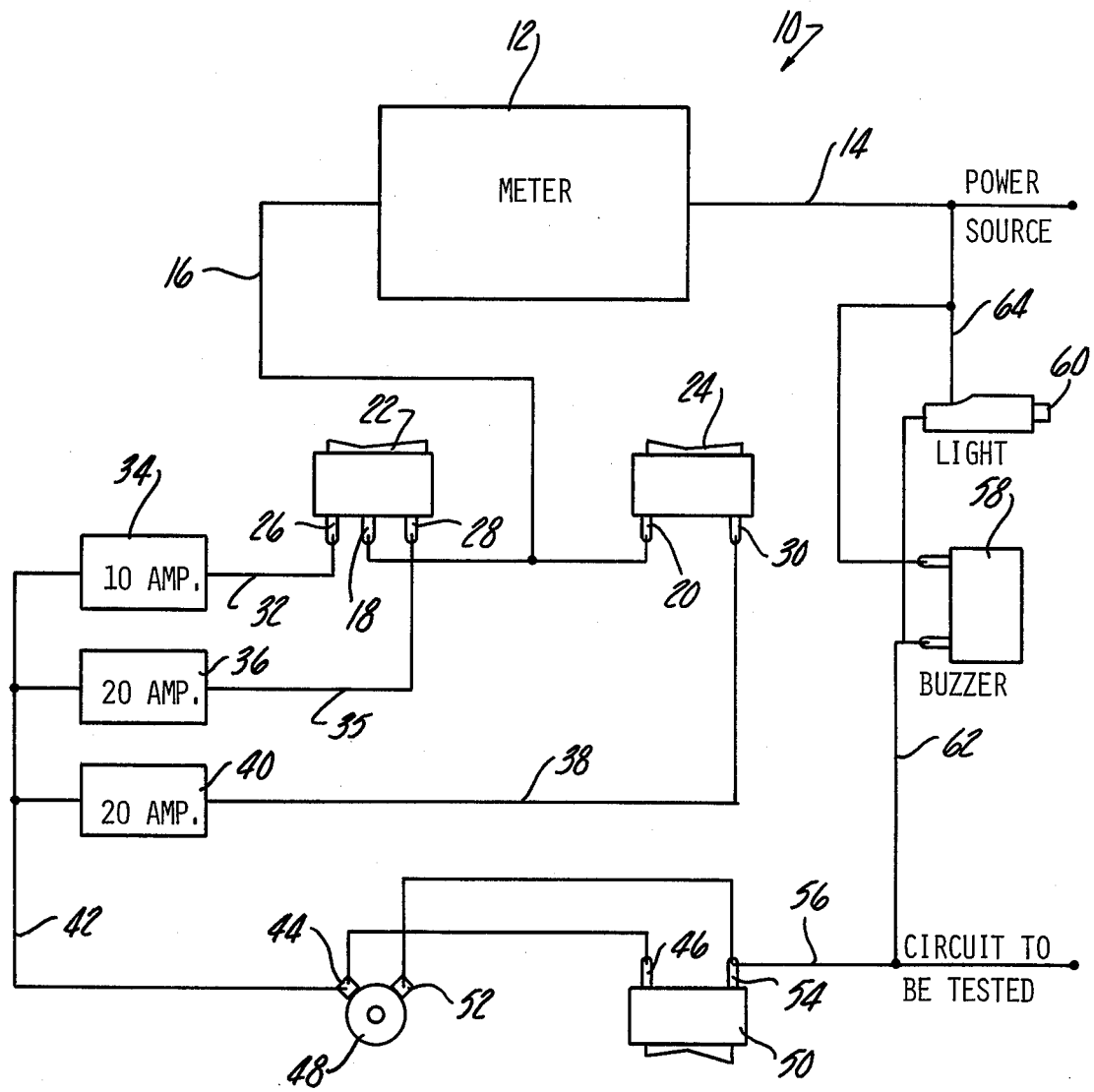

METER PROTECTION CIRCUIT

BACKGROUND OF THE INVENTION

I. Field of the Invention

The present invention relates to an electric meter protection circuit and, in particular, the present invention relates to a portable ammeter and a novel circuit to protect the electrical meter from damage due to overload.

II. Description of the Prior Art

Heretofore, numerous devices, apparatuses and electrical circuits have been devised for protecting electrical indicating instruments, such as ammeters and the like. Such indicating instruments generally are of the sensitive, low current variety and cannot readily be protected against burnout or damage due to overload because the current requirements for their full scale reading is usually low. Even in electrical indicating instruments which are adapted to have higher current flows, the systems and apparatuses designed to protect such instruments are complicated in their design and, thus, are expensive to construct and maintain. Examples of prior art apparatuses, devices and circuitry are disclosed in U.S. Letters Pat. No. 2,451,953; No. 2,505,465; No. 2,509,027; No. 2,516,756; No. 2,517,638; No. 2,584,800; No. 2,763,748; No. 2,902,651; No. 2,921,264; No. 2,941,149; No. 2,994,039; No. 3,024,388; and No. 3,042,865. To the knowledge of the inventor, none of the aforementioned Letters Pat. or any other apparatus or device discloses or suggests the novel arrangement for the meter protection circuit disclosed herein.

SUMMARY OF THE INVENTION

The present invention, which will be described subsequently in greater detail, comprises an electric indicating instrument, such as an ammeter, which is provided with a plurality of individually operable circuit breakers that are selectively activated to control the amount of amperage passing through the ammeter. The ammeter is connected to a source of electrical power, while the output of the circuit breakers are connected to the circuit desired to be tested. The circuit includes an on-off switch disposed between the circuit breakers and the circuit to be tested to selectively permit the operation of the test circuit. Signaling means in the form of lights and/or a buzzer are located between the input to the meter and the output from the on-off switch to provide a visual and/or audio indication of a circuit overload in the event one or more of the circuit breakers is activated to open the circuit and thereby protect the electric indicating instrument.

It is therefore a primary object of the present invention to provide an electrical measuring instrument, such as an ammeter, which has circuitry adapted to prevent damage to the electric indicating instrument due to overload.

It is a further object of the present invention to provide such a circuit which is very simple in its construction and design and, thus, one which can be readily and inexpensively manufactured and maintained.

Other objects, advantages and applications of the present invention will becme apparent to those skilled in the art of meter protection circuits when the accompanying description of one example of the best mode contemplated for practicing the invention is read in conjunction with the accompanying drawing.

BRIEF DESCRIPTION OF THE DRAWING

The description herein makes reference to the sole figure wherein a schematic illustration of a preferred meter protection circuit is shown.

DESCRIPTION OF THE PREFERRED EMBODIMENT

Referring now to the drawing wherein there is schematically illustrated one example of the present invention in the form of a meter protection circuit 10. The circuit 10 comprises an electric indicating instrument, such as a direct current ammeter 12, that has an input line 14 and an output line 16. The input line 14 is adapted to be connected to a source of electrical energy, such as a battery used in the conventional electric circuit of an automobile. The output 16 of the ammeter 12 is electrically connected to the input leads 18 and 20, respectively, of a pair of electrical switches 22 and 24. The electrical switch 22 is of the single pole, double throw type and, in one position, is adapted to electrically connect the input 18 to an output 26 and, in a second position, is adapted to electrically connect the input 18 to an output 28. The electric switch 24 is of the single pole, single throw type and, in one position, is adapted to electrically connect the input lead 20 to an output lead 30 and, in a second position, terminates the electrical connection between the input lead 20 and the output lead 30.

The output lead 26 of the switch 22 is connected through a suitable electric wire 32 to a circuit breaker 34 and is adapted to become operative and open the circuit when the same draws a preselected current, say 10 to 12 amps. The output lead 28 from the switch 22 is connected via suitable electric conduit 35 to a second circuit breaker 36, which is set to become operative and open the circuit when the current in the system exceeds a predetermined amount greater than the current necessary to activate the aforementioned circuit breaker 34. It is preferable that the circuit breaker 36 become operative when the current is between 20 and 25 amps. It can be seen from the aforementioned description that the ammeter 12 will be electrically connected to either the circuit breaker 34 or 36 during its operation. Additionally, as aforementioned, the output line 16 of the ammeter 12 may be electrically connected via a switch 24 and an electrical conduit 38 to a third circuit breaker 40. The third circuit breaker 40 is set to become operative to open the circuit at a value which preferably is equal to the value of the circuit breaker 36 and in the preferred embodiment will become operative when the current is between 20 and 25 amps.

As can be seen in the sole figure, the ouput leads of each of the circuit breakers are connected in parallel via conduit 42 which, in turn, is connected in parallel to the input terminals 44 and 46, respectively, of push-button switch 48 and on-off switch 50. Similarly, the output leads 52 and 54, respectively, of the switches 48 and 50 are connected in parallel and terminate in a test lead 56, which is adapted to be connected to the circuit which is desired to be tested. The input line 14 to the ammeter 12 and the output test lead 56 from the switches 48 and 50 are connected in parallel to overload buzzer 58 and overload warning light 60 through suitable electric conduits 62 and 64, respectively. It can thus be seen that when it is desired to test a circuit to determine the flow of amps therethrough, the input line 14 is connected to a power source while the test lead 56 is connected to the circuit desired to be tested. The switch 50 is positioned in the off position such that the circuit may be opened and closed by means of the push button 48. The button 48 is pushed such that the circuit will draw current therethrough. The user will utilize one or the other of the switches 22 and 24 to determine the amount of amperage that is desired to have pass through the ammeter 12. For example, if only 10 amps are desired to pass through the ammeter 12, the switch 22 is activated so as to connect the leads 18 and 26 while the switch 24 is moved to the off position, that is, terminating the electrical connection between the leads 20 and 30. On the other hand if it is desired to have 20 amps pass through the ammeter 12, the switch 22 is positioned so as to connect the leads 18 and 28 and, thus, the ammeter 12 with the circuit breaker 36. The switch 24 remains in the off position. If it is desired to have a total of 40 amps pass through the ammeter 12, then the switch 22 is positioned to connect the ammeter 12 with the circuit breaker 36; that is, the leads 18 and 28 are electrically connected. In addition, the switch 24 is turned to the on position; that is, the leads 20 and 30 are electrically connected. In this position the electric ammeter 12 is electrically connected to both circuit breakers 36 and 40, and thus a total of 40 amps may be drawn through the ammeter 12. It should be noted that the switch 24 should always be in an off position when the 10 amp circuit breeaker 34 is on.

If a high-current flow in the circuit should blow one of the circuit breakers, it can be seen that current will be directed through the buzzer 58 and light 60 whereupon the user of the instrument will be advised that a circuit breaker has become inoperative and the circuit is overloaded.

It can thus be seen that the present invention provides a new and improved circuit for protecting electrical indicating instruments, such as ammeters, and the same has been accomplished through a simple and inexpensive means.

Although only one form of the present invention has been disclosed, it should be apparent to those skilled in the art that other meter protection circuits may be had, all coming within the spirit of the invention and scope of the appended claims.

What is claimed is as follows:

1. A circuit for protecting an electrical meter comprising:
   a source of electrical energy;
   an electrical meter having an input and an output, said input being connected to said source of electrical energy;
   a first circuit breaker having a first amperage capacity;
   a second circuit breaker having an amperage capacity higher than said first circuit breaker;
   a third circuit breaker having an amperage capacity equal to the amperage capacity of said second circuit breaker;
   a first on-off switch connecting said meter output to said third circuit breaker;
   a second switch having its input connected to said meter output such that said second switch is electrically connected in parallel with said first switch, said second switch alternately connecting said electrical meter to said first and second circuit breakers;
   a third on-off switch electrically connected to the output of said circuit breakers, the output of said third on-off switch being connectable to an electric circuit which is desired to be tested; and
   signaling means connecting said meter input to said third switch output, said signaling means detecting a flow of current therebetween and providing a signal indicative that one of said circuit breakers has been activated to terminate the flow of electricity through said meter.

2. The circuit defined in claim 1 wherein said signaling means is an electric light disposed between said input of said electric meter and said output of said third switch.

3. The circuit defined in claim 1 wherein said signaling means is an electric buzzer electrically connected between said meter input and said third switch output.

* * * * *